(12) United States Patent
Rhyee et al.

(10) Patent No.: US 10,069,057 B2
(45) Date of Patent: Sep. 4, 2018

(54) THERMOELECTRIC MATERIAL, AND THERMOELECTRIC MODULE AND THERMOELECTRIC APPARATUS COMPRISING THE SAME

(71) Applicant: SK INNOVATION CO., LTD., Seoul (KR)

(72) Inventors: Jong-Soo Rhyee, Gyeonggi-do (KR); Sue-Kyung Oh, Gyeonggi-do (KR); Yoon-Min Kim, Seoul (KR)

(73) Assignee: SK INNOVATION CO., LTD., Seoul (KR)

( * ) Notice: Subject to any disclaimer, the term of this patent is extended or adjusted under 35 U.S.C. 154(b) by 73 days.

(21) Appl. No.: 15/162,368

(22) Filed: May 23, 2016

(65) Prior Publication Data
US 2016/0343928 A1    Nov. 24, 2016

(30) Foreign Application Priority Data
May 22, 2015  (KR) .................. 10-2015-0072000

(51) Int. Cl.
*H01L 35/16* (2006.01)
*H01L 35/10* (2006.01)
*C01B 19/00* (2006.01)

(52) U.S. Cl.
CPC ............ *H01L 35/16* (2013.01); *C01B 19/002* (2013.01); *C01B 19/007* (2013.01); *H01L 35/10* (2013.01); *C01P 2002/72* (2013.01); *C01P 2006/40* (2013.01)

(58) Field of Classification Search
CPC ....... H01L 35/16; H01L 35/10; C01B 19/002; C01B 19/007
USPC ........................................................ 136/238
See application file for complete search history.

(56) References Cited

U.S. PATENT DOCUMENTS

2016/0005947 A1*  1/2016  Suda ..................... H01L 35/16
                                                        136/212

OTHER PUBLICATIONS

Chen et al., Thermoelectric properties of p-type polycrystalline SnSe doped with Ag, Journal of Materials, Chemistry, pp. 1-16 (2014).*

* cited by examiner

*Primary Examiner* — Jayne L Mershon
(74) *Attorney, Agent, or Firm* — IP & T Group LLP

(57) ABSTRACT

Disclosed is a thermoelectric material including a Sn-chalcogen-based compound, wherein the Sn is doped with a first dopant element comprising a transition metal element or a p-type metalloid element. Further, disclosed are thermoelectric module and thermoelectric apparatus, comprising the thermoelectric material.

11 Claims, 6 Drawing Sheets

THERMOELECTRIC MATERIAL, AND THERMOELECTRIC MODULE AND THERMOELECTRIC APPARATUS COMPRISING THE SAME

CROSS-REFERENCE TO RELATED APPLICATIONS

This application claims the priority of Korean Patent Application No. KR 10-2015-0072000 filed on May 22, 2015, in the Korean Intellectual Property Office, the disclosure of which is incorporated herein by reference.

BACKGROUND

1. Technical Field

The present invention relates to a thermoelectric material, and a thermoelectric module and thermoelectric apparatus comprising the same.

2. Description of the Related Art

In general, thermoelectric materials can be utilized in active cooling, waste heat power generation, and the like by using Peltier effect and Seebeck effect.

The Peltier effect occurs when a direct-current (DC) voltage is applied and boles of a p-type material and electrons of an n-type material are transported to allow for a heat generation and a heat absorption at both ends of the materials. The Seebeck effect occurs when heat is supplied from an external heat source and a current flow is generated through the material while electrons and holes are transported to generate a power.

Active cooling with these thermoelectric materials improves the thermal stability of devices, does not cause vibration and noise, and does not use a separate condenser and refrigerant. Therefore, the volume of these devices is small and the active cooling method is environmentally friendly. Thus, active cooling that uses such thermoelectric materials can be applied in refrigerant-free refrigerators, air conditioners, micro-cooling systems, and the like. In particular, when a thermoelectric device is attached to a memory device, the temperature of the device can be maintained in a uniform and stable state, as compared to conventional cooling methods. Thus, the memory devices can have improved performance.

In addition, when thermoelectric materials are used in thermoelectric power generation using the Seebeck effect, waste heat can be used as an energy source. Thus, thermoelectric materials can be applied in a variety of fields that increase energy efficiency or reuse waste heat, such as in vehicle engines and air exhausts, waste incinerators, waste heat in iron mills, power sources of medical devices in the human body powered using human body heat, and the like.

As a factor for determining the performance of such thermoelectric materials, a dimensionless performance index ZT defined as Equation 1 below is used:

$$ZT = \frac{S^2 \sigma T}{k} \quad (1)$$

where S is a Seebeck coefficient, $\sigma$ is an electrical conductivity, T is an absolute temperature, and $\kappa$ is a thermal conductivity.

To increase the performance of such thermoelectric materials, the values of the dimensionless performance index ZT should increase. Accordingly, there is a need to develop a material having a high Seebeck coefficient and electrical conductivity and low thermal conductivity.

It has been known in the art that if a low dimensional nanostructure is prepared by a process for implementing a high ZT value, the Seebeck coefficient is increased by a quantum confinement effect, and if an energy barrier having a thickness shorter than the mean free path of electrons and longer than the mean free path of phonons is formed in a thermoelectric semiconductor, since an electricity is passed therethrough and a heat is blocked, ZT values are increased.

SUMMARY

The present disclosure provides a high-efficiency thermoelectric material, and a thermoelectric module and thermoelectric apparatus comprising the same through a doped Sn-chalcogen-based compound.

According to an aspect of the present disclosure, there is provided a thermoelectric material including a Sn-chalcogen-based compound, wherein the Sn is doped with a first dopant element including a transition metal element or a p-type metalloid element.

The molar ratio of the first dopant element to the Sn may be in the range of 1:9 to 4:6.

In the Sn-chalcogen-based compound, the chalcogen may be thither doped with a second dopant element including a halogen.

The molar ratio of the second dopant element to the chalcogen may be in the range of 1:99 to 1:9.

The thermoelectric material may include a compound of formula (1) below:

$$Sn_{1-x}M_x(Se_{1-a}Te_a)_{1-y}X_y \quad (1)$$

wherein M is a transition metal element or a p-type metalloid element; X is a halogen; x is 0<x<y is 0≤y<1; and a is 0≤a≤1.

The x may be 0.1≤x≤0.4.

The y may be 0.01≤x≤0.1.

The thermoelectric material may be a single-phase or a multi-phase.

When the thermoelectric material is a multi-phase, the first dopant element is reacted with the chalcogen in the Sn-chalcogen-based compound to form a first dopant element-chalcogen-based compound, wherein the first dopant element-chalcogen-based compound is phase separated from the Sn-chalcogen-based compound.

The thermoelectric material may further include dopant impurities.

The thermoelectric material may have an electrical conductivity of 3000 S/cm or more at 700K.

The thermoelectric material may have a density corresponding to 70% to 100% of the theoretical density.

According to another aspect of the present disclosure, there is provided a thermoelectric module, including a first electrode, a second electrode, and a thermoelectric device interposed between the first electrode and the second electrode, wherein the thermoelectric device may include the thermoelectric material.

According to a still another aspect of the present disclosure, there is provided a thermoelectric apparatus, including a heat supply source, a thermoelectric device for absorbing a heat from the heat supply source, a first electrode arranged in contact with the thermoelectric device, and a second electrode opposite the first electrode, the second electrode being arranged in contact with the thermoelectric device, wherein the thermoelectric device may include the thermoelectric material.

The present disclosure can provide a high-efficiency bulky thermoelectric material through either doping the Sn in a Sn-chalcogen-based compound with a first dopant element including a transition metal element or a p-type metalloid element, or compositely doping the Sn in a Sn-chalcogen-based compound with a first dopant element including a transition metal element or a p-type metalloid element, and the chalcogen in a Sn-chalcogen-based compound with a second dopant element including a halogen.

Therefore, the thermoelectric material may be suited for use in refrigerant-free refrigerators, air conditioners, waste heat power generation, thermoelectric, nuclear power generation for military and aerospace, micro-cooling system etc.

BRIEF DESCRIPTION OF DRAWINGS

The above and other objects and features of the present invention will become apparent from the following description of the disclosure, when taken in conjunction with the accompanying drawings, in which.

DETAILED DESCRIPTION

Hereinafter, embodiments of the present disclosure will be described in detail with reference to the accompanying drawings. It should be understood that the present disclosure is not limited to the following embodiments, and that the embodiments are provided for illustrative purposes only. The scope of the disclosure should be defined only by the accompanying claims and equivalents thereof.

The present inventors have found that, in the production of a thermoelectric material, the electrical conductivity is significantly increased by either doping a Sn-chalcogen-based compound with a first dopant element including a transition metal element or a p-type metalloid element, or compositely doping the Sn in a Sn-chalcogen-based compound with a first dopant element including a transition metal element or a p-type metalloid metalloid element, and the chalcogen in a Sn-chalcogen-based compound with a second dopant element including a halogen, and consequently have completed the present invention.

Hereinafter, the present invention will be described in detail.

According to some embodiments of the disclosure, the Sn in a Sn-chalcogen-based compound is doped with a first dopant element including a transition metal element or a p-type metalloid element.

As used herein, the Sn-chalcogen-based compound indicates SnSe, SnTe, or $Sn(Se_{1-x}Te_a)$ (0≤a≤1) compound, etc. Conventionally known SnSe compound has, in the case of single crystal structure, high thermoelectric performance where ZT value at 923K in a particular direction of b axis is 2.6. Such high thermoelectric performance is observed only in the single crystal structure. However, it is problematic that in the case of polycrystalline structure of the thermoelectric material the thermoelectric performance was significantly decreased. This is why the chemical stability of the material becomes significantly lowered due to a high vapor pressure of Se.

According to some embodiments of the disclosure, the Sn-chalcogen-based compound may use SnSe, SnTe, or $Sn(Se_{1-a}Te_a)$ (0≤a≤1) compound. Preferably, the Sn-chalcogen-based compound is SnTe or $Sn(Se_{1-a}Te_a)$ (0≤a<0.5) compound, in which chalcogen base material is Te, not Se having a high vapor pressure, and more preferably SnTe compound.

Figure 1:
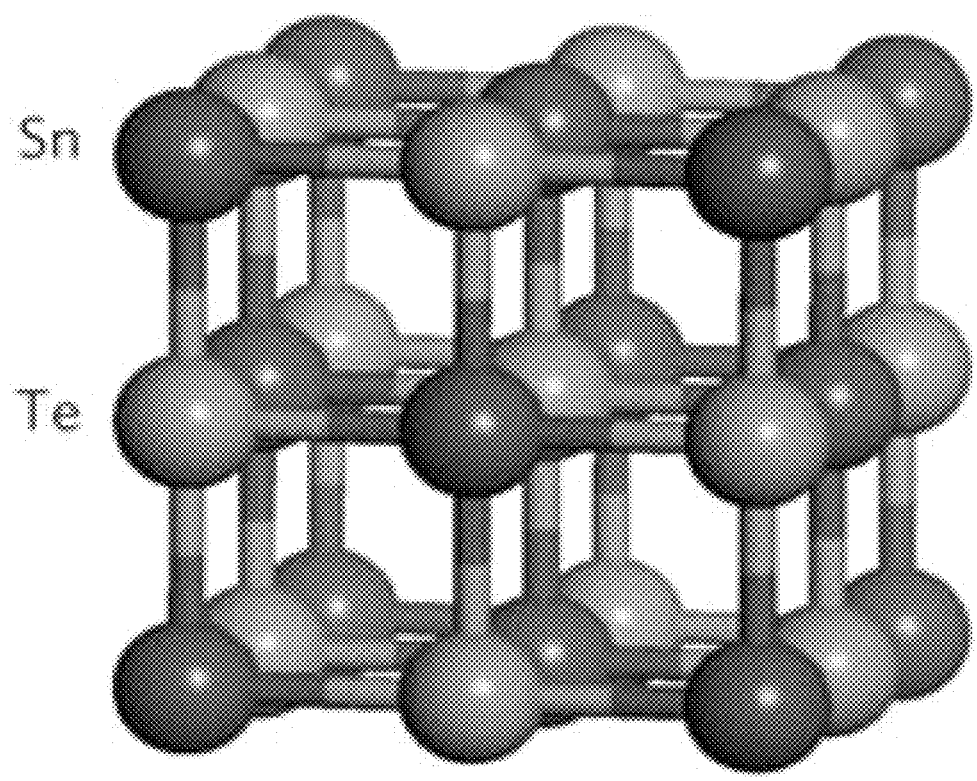
FIG. 1 is a schematic diagram showing a crystal structure of SnTe compound.

FIG. 1 is a schematic diagram showing a crystal structure of SnTe compound. Referring to FIG. 1, SnTe compound has a hexagonal crystal structure, wherein its lattice constant is 6.309 Å.

In addition, the first dopant element is an element to be doped in the Sn of the Sn-chalcogen-based compound. The first dopant element may include a transition metal element such as Au, Cu and Zn, or a p-type metalloid element such as Ga and In. Among the first dopant element, Ag is particularly preferred since it is doped well and the control of its chemical potential is easy.

The molar ratio of the first dopant element and the Sn is preferably in the range of about 1:9 to about 4:6. If the molar ratio is less than the above range, since a less content of the first dopant element is contained, the chemical potential may not be adjusted well or the phase separation may not be good. On the contrary, if the molar ratio exceeds the above range, since the content of the first dopant element is excessive, the chemical potential may be excessively increased or some of the first dopant element may be precipitated as inclusions, resulting in the deterioration of the thermoelectric performance.

For example, when Sn in the SnTe compound is doped with Ag whose ion radius is wearer than Sn, the distance between the molecules becomes closer than before due to a strong binding force of Ag. Therefore, as a large amount of Ag is doped, the lattice constant will be reduced.

Further, in the Sn-chalcogen-based compound, Sn may be doped with a second dopant element including a halogen element.

The second dopant element is an element to which the chalcogen in the Sn-chalcogen-based compound is doped. The second dopant element may include a halogen element such as I, Br, Cl, etc.

The molar ratio of the second dopant element and the chalcogen is preferably in the range of about 1:99 to about 1:9. If the molar ratio is less than the above range, since less content of the second dopant element is contained, it is difficult to control the chemical potential. On the contrary, if the molar ratio exceeds the above range, since excessive content of the second dopant element is contained, the second dopant element may be precipitated as inclusions, resulting in the deterioration of the thermoelectric performance.

In particular, when the Sn-chalcogen-based compound is compositely doped in such a way that the Sn is doped with the first dopant element including a transition metal element or a p-type metalloid element, and the chalcogen is doped with the second dopant element including a halogen, the increase of the electrical conductivity with the increase of the chemical potential may occur in combination with the reduction of the thermal conductivity with a phonon scattering caused by multiple element substitutions with the second dopant element. As a result, high-efficient thermoelectric materials in bulk having very high electrical conductivity and low thermal conductivity can be achieved.

Specifically, the thermoelectric material may include a compound of formula (1) below:

$$Sn_{1-x}M_x(Se_{1-a}Te_a)_{1-y}X_y \qquad (1)$$

wherein M indicates a transition metal element or a p-type metalloid element; X indicates a halogen; x is 0<x<1; y is 0≤y<1; and a is 0≤a≤1.

More particularly, x may be 0.1≤x≤0.4, and y may be 0.01≤x≤0.1.

The thermoelectric material may be a polycrystalline structure. The polycrystalline structure may be synthesized by a polycrystalline synthesis method. The polycrystalline synthesis method may include ampoule method, arc melting method, solid state reaction method, etc. and will be briefly described as follows:

(1) Ampoule method: this method involves adding a material element to an ampoule made of a quartz tube or a metal, sealing the ampoule in a vacuum and heat treating the ampoule;

(2) Arc melting method: this method involves adding a material element to a chamber, discharging an arc in an inert gas atmosphere to dissolve the material element, thereby resulting in the formation of a sample; and (3) Solid state reaction method: this method involves mixing a powder material and then heat treating the resultant material, or heat treating the mixed powder, and then processing and sintering the resultant powder.

The thermoelectric material may be a single-phase or a multi-phase.

When the thermoelectric material is a multi-phase, the first dopant element is reacted with the chalcogen in the Sn-chalcogen-based compound to form a first dopant element-chalcogen-based compound, wherein the first dopant element-chalcogen-based compound is phase separated from the Sn-chalcogen-based compound. This phase separation is made by melting a raw material by a heat-treatment, and then cooling the melt at a suitable temperature condition. In this case, the Sn-chalcogen-based compound is a main phase, and the first dopant element-chalcogen-based compound is a separated phase.

The thermoelectric material may be of a bulk shape, or any bulk having various shapes such as rectangular parallelepiped, regular hexahedron, cylindrical, or polygonal rod-like shapes, which are appropriate according to the usage thereof.

The thermoelectric material may further include dopant impurities. With the dopant impurities, two band conduction in which electrons and holes co-exist is prevented, so an electron or hole conduction mainly occurs, and as a result the power factor can be improved while the thermal conductivity can be reduced. Specifically, in addition that the Sn in the Sn-chalcogen-based compound is doped with the first dopant element, the Sn may further doped with at least one impurity selected from the group consisting of B, C, Si, alkaline metal or alkaline earth metal, and the like. Further, in addition that the chalcogen in the Sn-chalcogen-based compound is doped with the second dopant element, the Sn may further doped with at least one impurity selected from P, Sb and the like.

The thermoelectric material may have an electrical conductivity of 3000 S/m or more at 700K. This is an excellent effect caused by the doping of the first dopant element including as transition metal element or a p-type of metalloid, element with which the Sn in the Sn-chalcogen-based element is doped.

The thermoelectric material may have a density corresponding to 70% to 100% of the theoretical density by a densification process, and preferably have 95% to 100% of the theoretical density. By this densification process, it is possible to further improve the electrical conductivity.

The densification process may include for example the following three methods:

(1) Hot press method: this method involves filling a powder compound into a mold having a predetermined shape, and molding the compound at a high temperature, e.g., 300 to 800° C., and at a high pressure, e.g., 30 to 300 MPa;

(2) Spark plasma sintering method: this method involves sintering a powder compound in a short period of time by applying a high voltage current, e.g., about 50 to 500 amperes (A); and (3) Hot forging method: this method involves extrusion-sintering a powder compound at a high temperature, e.g., about 300° C. to about 700° C., when the powder compound is press molded.

The thermoelectric material may be molded by cutting process, etc. to form a thermoelectric device. The thermoelectric device may be of a p-type thermoelectric device or an n-type thermoelectric device. The thermoelectric device is meant by a device formed as a predetermined shape such as a rectangular parallelepiped shape using the thermoelectric material.

Meanwhile, the thermoelectric device may be a device that can be combined with an electrode and produce a cooling effect by an applied electric current or generate a power by a temperature difference.

According to an embodiment of the disclosure there is provided a thermoelectric module, including a first electrode, a second electrode, and a thermoelectric device interposed between the first electrode and the second electrode, wherein the thermoelectric device may include the thermoelectric material.

According to another embodiment of the disclosure, there is provided a thermoelectric apparatus including a thermoelectric module, including a heat supply source, a thermoelectric device for absorbing a heat from the heat supply source, a first electrode arranged in contact with the thermoelectric device, and a second electrode opposite the first electrode, the second electrode being arranged in contact with the thermoelectric device, wherein the thermoelectric device comprises the thermoelectric material.

As previously discussed, the present disclosure can provide a high-efficiency bulky thermoelectric material through either doping the Sn in a Sn-chalcogen-based compound with a first dopant element including a transition metal element or a p-type metalloid element, or compositely doping the Sn in a Sn-chalcogen-based compound with a first dopant element including a transition metal element or a p-type metalloid element, and the chalcogen in a Sn-chalcogen-based compound with a second dopant element including a halogen.

Therefore, the thermoelectric material according to the present disclosure may be suited for use in refrigerant-free refrigerators, air conditioners, waste heat power generation, thermoelectric nuclear power generation for military and aerospace, micro-cooling system, etc.

Hereinafter, the present disclosure will be described in more detail with reference to some preferred examples. However, it should be understood that the following examples are provided for illustrative purposes only and are not to be in any way construed as limiting the present disclosure.

EXAMPLES

Example 1

Each of elements Sn and Te was weighed based on the compositional ratio, and filled into a quartz tube, and then vacuum sealed. The mixture was allowed to melt at 800° C. for 24 hours, and then cooled slowly at a rate of 10° C./h to form $Sn_{1-x}Ag_xTe$ (where x=0.1, 0.2, 0.3 or 0.4) compound. The compound was transferred into a graphite mold, and press-sintered at the temperature of 400° C. and at a pressure of 70 MPa for 1 hour to obtain a thermoelectric material having a density corresponding to 95% of the theoretical density.

Figure 2:
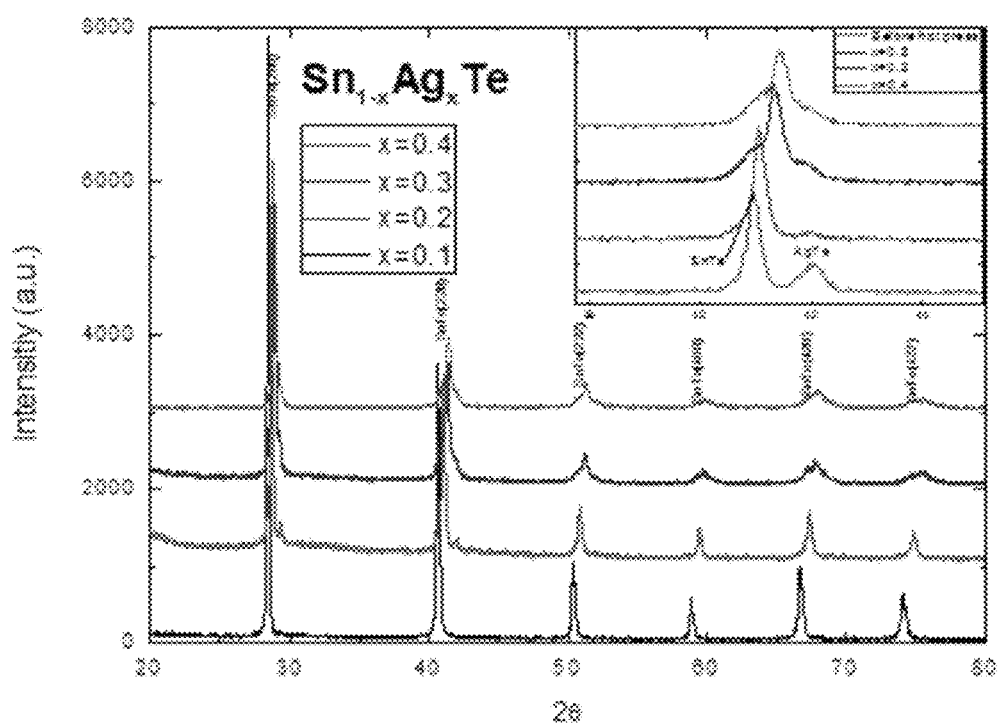
FIG. 2 is a graph showing the results analyzed by X-ray diffractometer of compound $Sn_{1-x}Ag_xTe$ (x=0.1, 0.2, 0.3 or 0.4) in accordance with an embodiment of the present disclosure which is press sintered at a high temperature to form a single phase thermoelectric material.

Referring to FIG. 2, the thermoelectric material prepared according to Example 1 had a single phase, where SnTe and AgTe peaks were observed as s wide single peak. It suggests that Sn in SnTe is doped with A.

Example 2

Each of elements Sn and Te was weighed based on the compositional ratio, and filled into a quartz tube, and then vacuum sealed. The mixture was allowed to melt at 800° C. for 24 hours, and then quenched at 500° C. to form AgTe compound. Then AgTe compound was phased separated from SnTe. The compound was transferred into a graphite mold, and press-sintered at a temperature of 400° C. and at a pressure of 70 MPa for 1 hour, to obtain a thermoelectric material having a density corresponding to 95% of the theoretical density.

Figure 3:
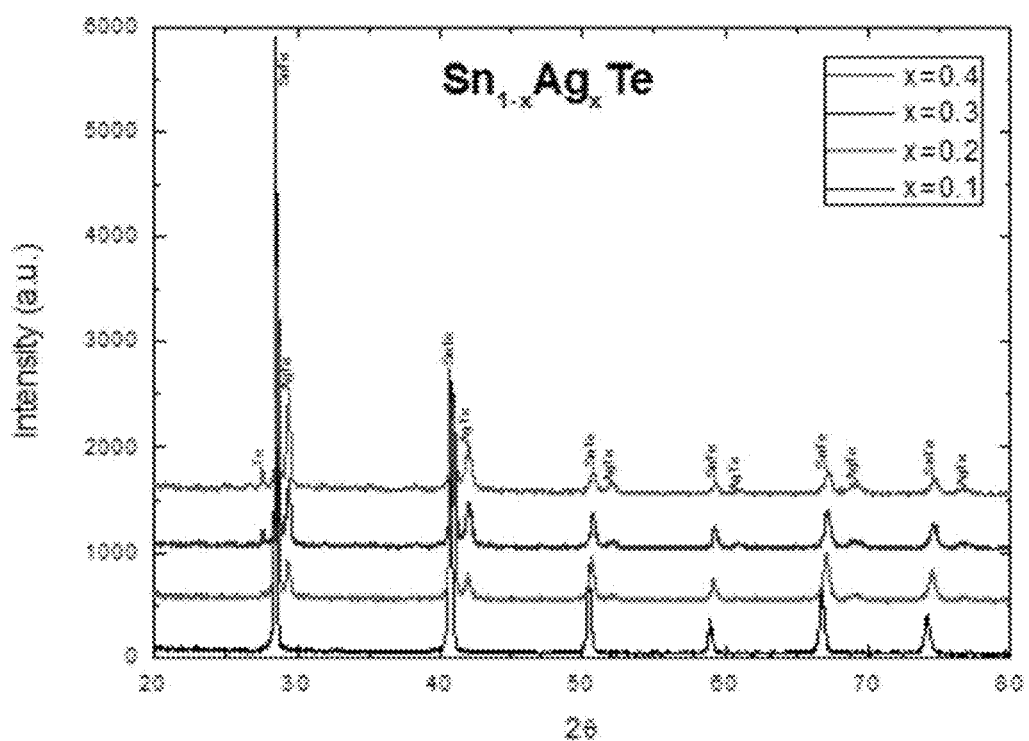
FIG. 3 is a graph showing the results analyzed by X-ray diffractometer of compound $Sn_{1-x}Ag_xTe$ (x=0.1, 0.2, 0.3 or 0.4) in accordance with an embodiment of the present disclosure which is press sintered at a high temperature to form a multi-phase thermoelectric material.

Referring to FIG. 3, the thermoelectric material prepared according to Example 2 had a multi-phase, where SnTe and AgTe peaks were observed, respectively. It suggests that SnTe compound is a main phase, and AgTe compound is a separated phase.

Figure 4:
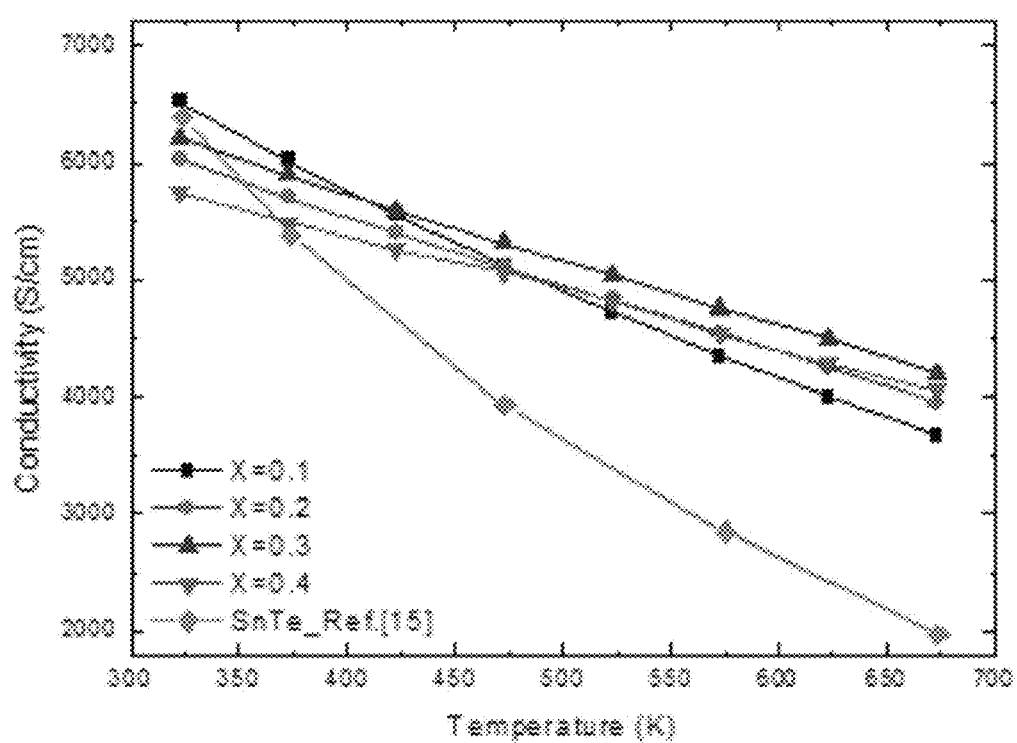
FIG. 4 is a graph showing an electrical conductivity versus a temperature of $Sn_{1-x}Ag_xTe$ (x=0.1, 0.2, 0.3 or 0.4 thermoelectric material in accordance with an embodiment of the present disclosure.

FIG. 4 is a graph showing an electrical conductivity versus a temperature of thermoelectric material $Sn_{1-x}Ag_xTe$ (where x=0.1, 0.2, 0.3 or 0.4) in accordance with an embodiment of the present disclosure.

Referring to FIG. 4, it as found that since the thermoelectric material $Sn_{1-x}Ag_xTe$ (where x=0.1, 0.2, 0.3 or 0.4) in accordance with an embodiment of the present disclosure had the electrical conductivities which increased with decreasing temperature levels, the thermoelectric material acted as a degenerated semiconductor or a semimetal. Further, it was found that since the thermoelectric material had a very high level of electrical conductivity of 3000 S/cm or more at 700K, the effects stemming from the Ag doping as particularly excellent in high temperature region of about 700K.

Figure 5:
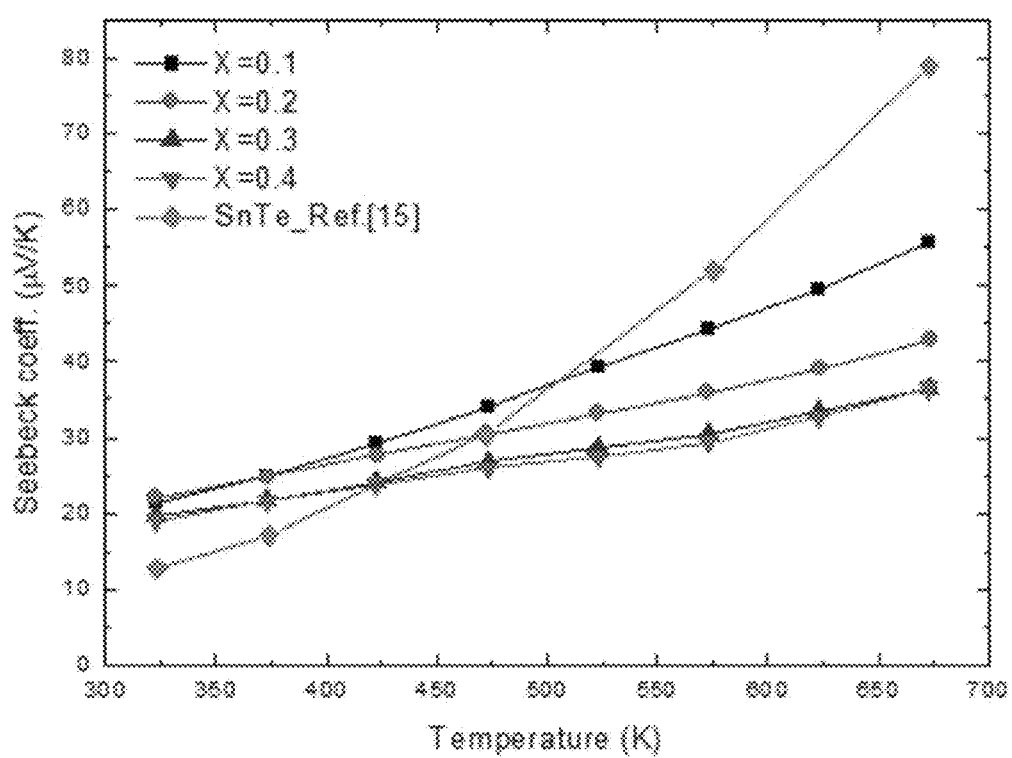
FIG. 5 is a graph showing a Seebeck coefficient versus a temperature of $Sn_{1-x}Ag_xTe$ (x=0.1, 0.2, 0.3 or 0.4) thermoelectric material in accordance with an embodiment of the present disclosure.

FIG. 5 is a graph showing a Seebeck coefficient versus a temperature of thermoelectric material $Sn_{1-x}Ag_xTe$ (x=0.1, 0.2, 0.3 or 0.4) in accordance with an embodiment of the present disclosure.

Referring to FIG. 5, it was found that since the thermoelectric material $Sn_{1-x}Ag_xTe$ (where x=0.1, 0.2, 0.3 or 0.4) in accordance with an embodiment of the present disclosure had the Seebeck coefficients which increased with increasing temperature levels, the effects stemming from the Ag doping was particularly excellent in an ambient medium temperature region of between about 300K and about 400K.

Figure 6:
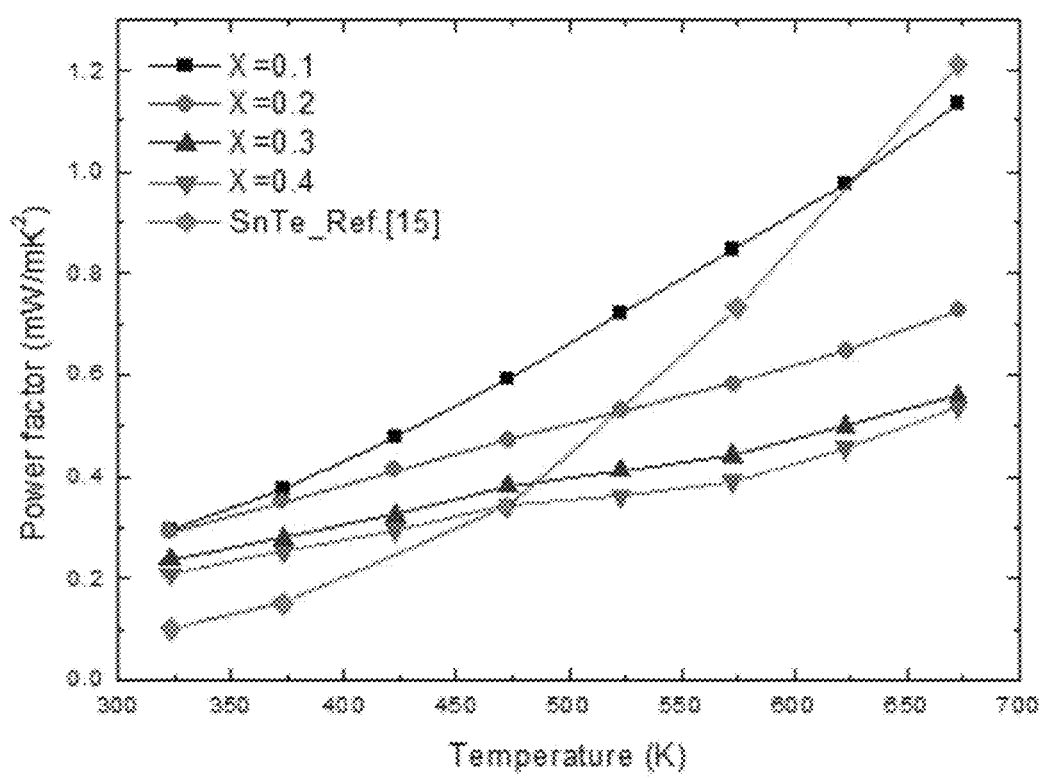
FIG. 6 is a graph showing a power factor versus a temperature of $Sn_{1-x}Ag_xTe$ (x=0.1, 0.2, 0.3 or 0.4) thermoelectric material in accordance with an embodiment of the present disclosure.

FIG. 6 is a graph showing a power factor versus a temperature of thermoelectric material $Sn_{1-x}Ag_xTe$ (x=0.1, 0.2, 0.3 or 0.4) in accordance with an embodiment of the present disclosure.

Referring to FIG. 6, it was found that since the thermoelectric material $Sn_{1-x}Ag_xTe$ (where x=0.1, 0.2, 0.3 or 0.4) in accordance with an embodiment of the present disclosure had the power factors which increased with increasing temperature levels, the effects stemming from the Ag doping was particularly excellent in an ambient medium temperature region of between about 300K and about 400K.

Description of the invention described above are for illustrative purposes, One of ordinary skill in the art can understand that it is possible to easily modified in other specific forms without changing the technical spirit or essential features of the invention will. Thus, embodiments described above are illustrative and in any way should be understood as non-limiting.

What is claimed is:

1. A thermoelectric material comprising a Sn-chalcogen-based compound, wherein the Sn is doped with a first dopant element comprising an Ag,
    wherein in the Sn-chalcogen-based compound, the chalcogen is further doped with a second dopant element comprising a halogen, and
    wherein the molar ratio of the second dopant element to the chalcogen is in the range of 1:99 m 1:9.

2. The thermoelectric material of claim 1, wherein the molar ratio of the first dopant element to the Sn is in the range of 1:9 to 4:6.

3. A thermoelectric material comprising an Sn-chalcogen-based compound, wherein the Sn is doped with a first dopant element comprising an Ag,
    and the thermoelectric material comprising a compound of the formula (1):

$$Sn_{1-x}M_x(Se_{1-a}Te_a)_{1-y}X_y \qquad (1)$$

wherein M indicates an Ag;
X indicates a halogen;
x is 0<x<1; y is 0.01≤y≤0.1; and a is 0≤a≤1.

4. The thermoelectric material of claim 3, wherein x is 0.1≤x≤0.4.

5. The thermoelectric material of claim 1, which is a single-phase or a multi-phase.

6. The thermoelectric material of claim 5, wherein when the thermoelectric material is a multi-phase, the first dopant element is reacted with the chalcogen in the Sn-chalcogen-based compound to form a first dopant element-chalcogen-based compound, wherein the first dopant element-chalcogen-based compound is phase separated from the Sn-chalcogen-based compound.

7. The thermoelectric material of claim 1, further comprising dopant impurities.

8. The thermoelectric material of claim 1, which has an electrical conductivity of 3000 S/cm or more at 700K.

9. The thermoelectric material of claim 1, which has a density corresponding to 70% to 100% of the theoretical density.

10. A thermoelectric module, comprising:
a first electrode, a second electrode, and a thermoelectric device interposed between the first electrode and the second electrode, wherein the thermoelectric device comprises the thermoelectric material of claim 1.

11. A thermoelectric apparatus, comprising:

a heat supply source, a thermoelectric device for absorbing a heat from the heat supply source, a first electrode arranged in contact with the thermoelectric device, and a second electrode arranged opposite the first electrode, the second electrode being arranged in contact with the thermoelectric device, wherein the thermoelectric device comprises the thermoelectric material of claim 1.

* * * * *